United States Patent [19]
Hayashi

[11] Patent Number: 5,633,181
[45] Date of Patent: May 27, 1997

[54] FABRICATION METHOD OF SEMICONDUCTOR INTEGRATED CIRCUIT DEVICE HAVING CAPACITORS, BIPOLAR TRANSISTORS AND IGFETS

[75] Inventor: Shigeru Hayashi, Tokyo, Japan

[73] Assignee: NEC Corporation, Tokyo, Japan

[21] Appl. No.: 535,836

[22] Filed: Sep. 28, 1995

[30] Foreign Application Priority Data

Sep. 29, 1994 [JP] Japan ................................. 6-235155

[51] Int. Cl.$^6$ ................................. H01L 21/265
[52] U.S. Cl. .................. 438/234; 438/396; 438/253; 438/210
[58] Field of Search .................. 437/31, 34, 47, 437/49, 51, 59, 60, 162; 148/DIG. 9

[56] References Cited

U.S. PATENT DOCUMENTS

| | | | |
|---|---|---|---|
| 4,737,472 | 4/1988 | Schaber et al. | 437/31 |
| 4,939,099 | 7/1990 | Seacrist et al. | 437/31 |
| 4,962,052 | 10/1990 | Asayama et al. | 437/34 |
| 5,118,633 | 6/1992 | Sagara et al. | 437/31 |
| 5,273,915 | 12/1993 | Hwang et al. | 437/34 |
| 5,457,062 | 10/1995 | Keller et al. | 437/60 |

FOREIGN PATENT DOCUMENTS 59-89450  5/1984  Japan.
64-22057  1/1989  Japan.

Primary Examiner—Tuan H. Nguyen
Attorney, Agent, or Firm—Young & Thompson

[57] ABSTRACT

A fabrication method that enables to realize a semiconductor integrated circuit device having capacitors, bipolar transistors and IGFETs at a lower fabrication cost and a higher fabrication yield than the case of the conventional ones. After a first patterned conductor film having contours of first capacitor electrodes and of base electrodes is formed, a first patterned insulator film is formed on the first capacitor electrodes to produce first dielectrics A second patterned conductor film having contours of second capacitor electrodes and of gate electrodes is then formed on the first capacitor electrodes and the gate insulators. A second patterned insulator film is formed on the second capacitor electrodes to produce second dielectrics. A third patterned conductor film having contours of third capacitor electrodes and of emitter electrodes is formed on the second dielectrics, the base regions and source/drain regions. Each capacitor has a multi-layer structure of the first capacitor electrode, the first dielectric, the second capacitor electrode the second dielectric, and the third capacitor electrode. Each bipolar transistor has the base electrode contacted with the base region and the emitter electrode contacted with the emitter region.

11 Claims, 5 Drawing Sheets

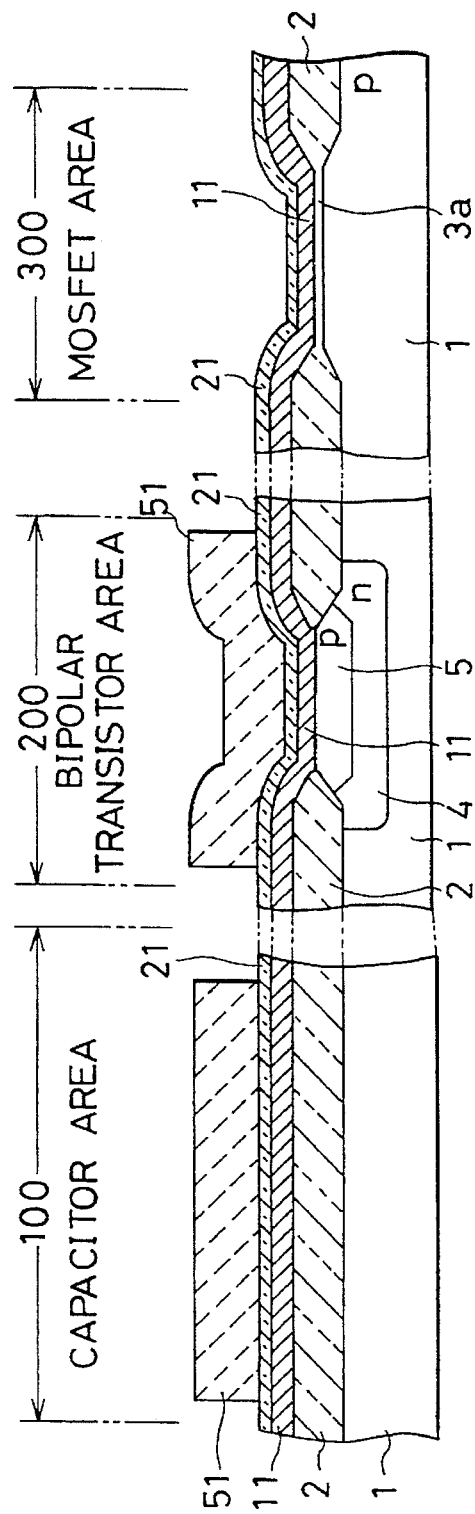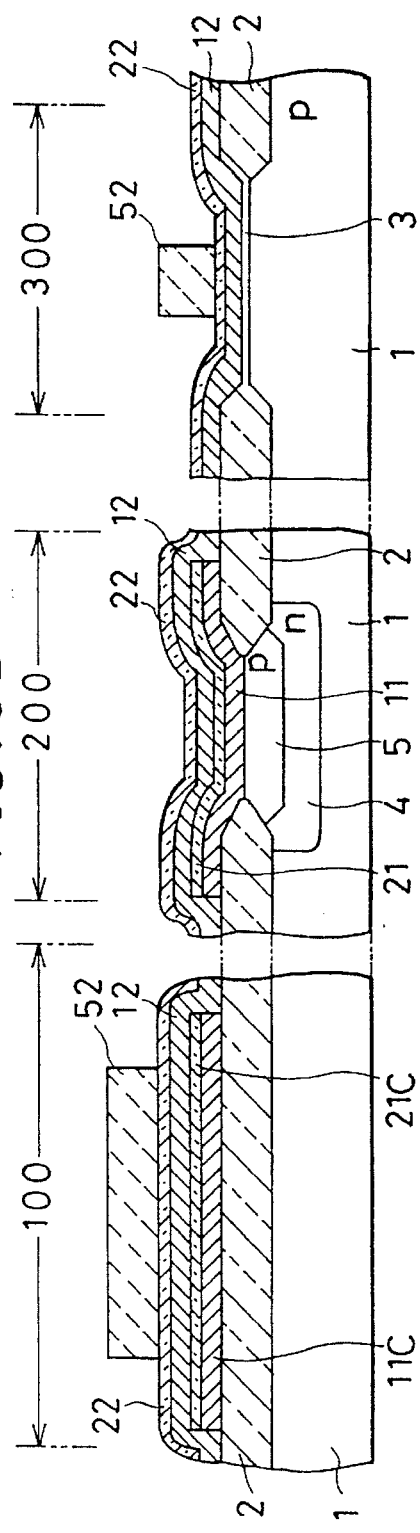

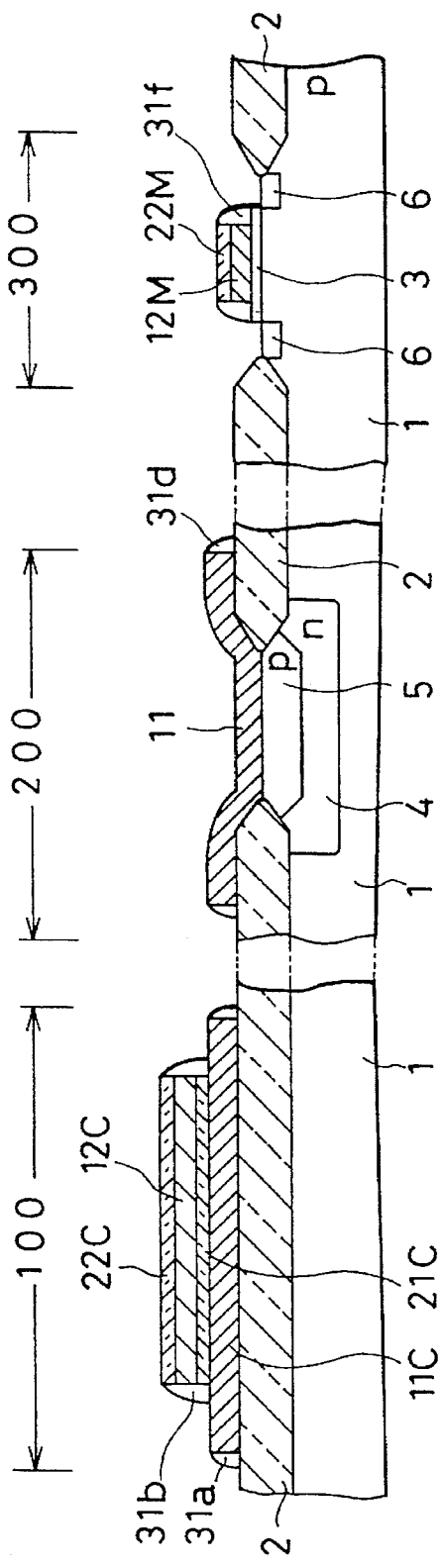
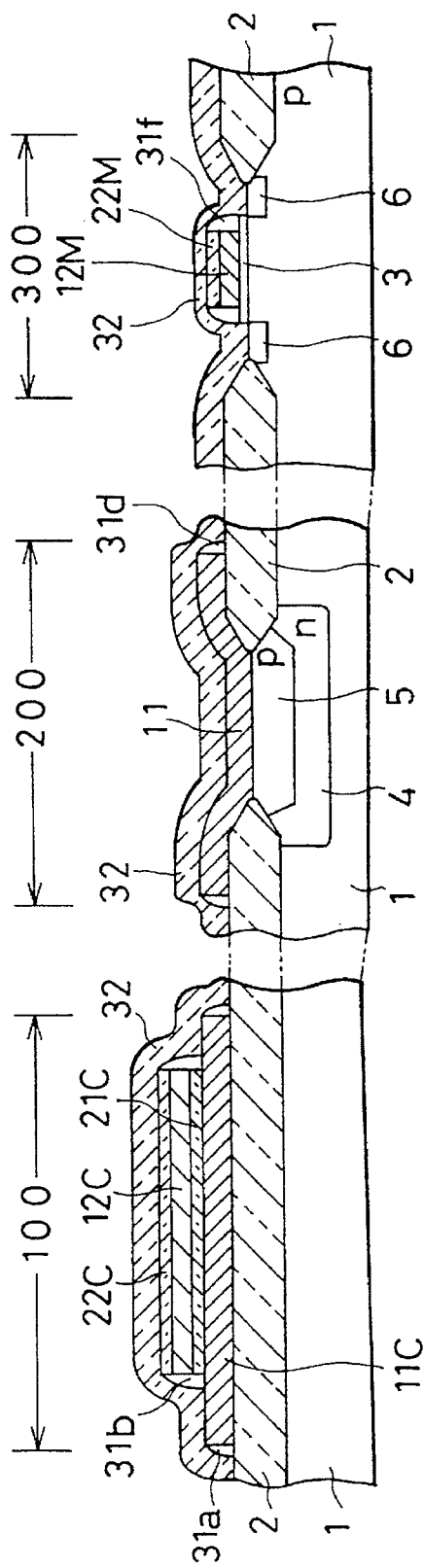

FABRICATION METHOD OF SEMICONDUCTOR INTEGRATED CIRCUIT DEVICE HAVING CAPACITORS, BIPOLAR TRANSISTORS AND IGFETS

BACKGROUND OF THE INVENTION

1. Field of the Invention

The present invention relates to a fabrication method of a semiconductor integrated circuit device and more particularly, to a fabrication method of a semiconductor integrated circuit device having capacitors, bipolar transistors and insulated-gate field-effect transistors (IGETs) on a semiconductor substrate.

2. Description of the Prior Art

Recently, with the conventional various semiconductor integrated circuit devices containing capacitors, the capacitors occupy a comparative large chip area and therefore, various types of the capacitors that enable to reduce the chip area and to keep or increase their capacitance have been developed.

An example of such the conventional semiconductor integrated circuit devices is disclosed in the Japanese Non-Examined Patent Publication No. 59-89450, which was published in May 1984.

This device has a semiconductor substrate of a first conductivity type, a first conductor layer of a second conductivity type formed on or in the substrate, a first insulator layer formed on the first conductor layer, a second conductor layer formed on the first insulator layer, a second insulator layer formed on the second conductor layer, a third conductor layer formed on the second insulator layer, a third insulator layer formed on the third conductor layer, a fourth conductor layer formed on the third insulator layer, a fourth insulator layer formed on the fourth conductor layer, and a fifth conductor layer formed on the fourth insulator layer. These stacked layers constitute a multi-layer capacitor. The first conductor layer may be a diffusion layer formed in the substrate.

If the first conductor layer is used as a part of the multi-layer capacitor, the capacitor is made of the first, second, third, fourth and fifth conductor layers and of the first, second, third and fourth insulator layers. The first, third and fifth conductor layers are electrically connected to each other. The second and fourth conductor layer are electrically connected to each other. The multi-layer capacitor is equivalent to a set of four parallel-connected capacitors.

If the first conductor layer is not used as a part of the multi-layer capacitor, the multi-layer capacitor is made of the second, third, fourth and fifth conductor layers and of the second, third and fourth insulator layers. The third and fifth conductor layers are electrically connected to each other. The second and fourth conductor layers are electrically connected to each other. The multi-layer capacitor is equivalent to a set of three parallel-connected capacitors.

The Japanese Non-Examined Patent Publication No. 59-89450 discloses the semiconductor device structure containing such the multilayer-capacitor alone.

Another example of such the conventional semiconductor integrated circuit devices is disclosed in the Japanese Non-Examined Patent Publication No. 64-22057 published in Jan. 1989. This device has both capacitors as passive elements and Metal-Oxide-Semiconductor FETs (MOSFETs) as active elements, which is described below referring to FIG. 1.

Although the device has a plurality of capacitors and a plurality of MOSFETs, only one of the capacitors and only one of the MOSFETs are shown in FIG. 1 for the sake of simplification of description.

In FIG. 1, a field insulator film 92 is selectively formed on a main surface of a p-silicon substrate 91, defining an active region for the MOSFET 70 thereon. In the active region, a pair of n-source/drain regions 71 are formed apart from each other in the substrate 91. A gate insulator film 72 is selectively formed on the main surface o the substrate 61 between the pair of source/drain regions 71. A gate electrode 73, which is made of a first polysilicon film, is formed on the gate insulator film 72. A pair of insulator sidewalls 74 are formed at each side of the gate electrode 73 on the gate insulator film 772 and the exposed main surface of the substrate 91. A covering insulator film 75 is formed to cover the top of the gate electrode 73.

A capacitor 80 having a multi-layer structure is provided adjacent to the MOSFET 770. The capacitor 80 is composed of a first capacitor electrode 81 made of a second polysilicon film, a first dielectric 82 a second capacitor electrode 83 made of a third polysilicon film, a second dielectric 84, and a third capacitor electrode 85 made of a fourth polysilicon film.

The first capacitor electrode 81 is formed on one of the pair of source/drain regions 71, the field insulator film 92, a corresponding one of the pair of sidewalls 74, and the covering insulator film 75, so that the electrode 81 is electrically connected to the contacting source/drain region 71. The first dielectric 82 is formed on the first capacitor electrode. 81. The second capacitor electrode 83 is formed on the first dielectric film 82. The second dielectric 84 is formed on the second capacitor electrode 83. The third capacitor electrode 85 is formed on the second dielectric 84.

A connection conductor film 86 is formed to cover the third capacitor electrode 85. The first capacitor electrode 81 are exposed from the second dielectric 82 at their both ends with which the connection conductor 6 is contacted. Thus, the first and third capacitor electrodes 81 and 85 are electrically connected to each other.

The side faces of the first capacitor electrode 81 at its ends are covered with insulator sidewalls 87a, respectively. The side faces of the second and third capacitor electrodes 83 and 85 at their ends are covered with insulator sidewalls 87b, respectively. The side faces of the connection conductor film 86 at its ends are covered with insulator sidewalls 87c, respectively.

The multi-layered capacitor 80 is equivalent to a set of two parallel-connected capacitors, one of which is composed of the first and second capacitor electrodes 81 and 83 and the first dielectric 82 placed therebetween and the other is composed of the third and second capacitor electrodes 85 and 83 and the second dielectric 84 placed therebetween.

With the conventional semiconductor integrated circuit device shown in FIG. 1, the gate electrode 73 of the MOSFET 70 is made of the first polysilicon film, and the first to third capacitor electrodes 81, 83 and 85 of the capacitor 80 are respectively made of the second, third and fourth polysilicon films. In other words, the gate electrode 73 is produced by using a polysilicon film other than those of the capacitor electrodes 81, 83 and 85 during a different process step. Accordingly the number of the necessary process steps for fabricating the conventional device increases, resulting in a high fabrication cost.

Also, since a part of the capacitor 80 is stacked on the MOSFET 70, high steps are generated over the substrate 61. Thus, the step coverage deteriorates and the fabrication yield decreases.

SUMMARY OF THE INVENTION

Accordingly, an object of he present invention is to provide a fabrication method of a semiconductor integrated circuit device that enables to realize a semiconductor integrated circuit device having capacitors, bipolar transistors and IGFETs at a lower fabrication cost and a higher fabrication yield than the case of the conventional ones.

A fabrication method of a semiconductor integrated circuit device according to the present invention includes the following steps:

First, a first patterned conductor film, which has contours of first capacitor electrodes in capacitor areas and contours of base electrodes in bipolar transistor areas, is formed. The first conductor film is contacted with base regions in the bipolar transistor areas.

Next, a first patterned insulator film is formed on the first capacitor electrodes to produce first dielectrics.

A Second patterned conductor film, which has contours of second capacitor electrodes in the capacitor areas and contours of gate electrodes in the IGFET areas, is then formed on the first capacitor electrodes in the capacitor areas and on gate insulators in the IGFET areas.

A second patterned insulator film is formed on the second capacitor electrodes to produce second dielectrics.

A third patterned conductor film, which has contours of third capacitor electrodes in the capacitor areas and contours of emitter electrodes in the bipolar transistor areas, is formed on the second dielectrics in the capacitor areas, on the base regions in the bipolar transistor areas, and on source/drain regions in the IGFET areas.

Each of the capacitors has a multi-layer structure of the first capacitor electrode, the first dielectric, the second capacitor electrode, the second dielectric, and the third capacitor electrode. Each of the bipolar transistors has the base electrode contacted with the base region, and the emitter electrode contacted with the emitter region.

With the method according to the present invention, the first capacitor electrodes and the base electrodes of the bipolar transistors are formed by the first conductor film, the second capacitor electrodes and the gate electrodes of the IGFETs are formed by the second conductor film, and the third capacitor electrodes and the emitter electrodes of the bipolar transistors are formed by the third conductor film. Therefore, the capacitors can be produced during the process steps for forming the bipolar transistors and the IGFETs with no additional process steps. This leads to a lower fabrication cost than the case of the conventional ones.

Also, since the capacitors are not arranged to be stacked or overlapped on the bipolar transistors and the IGFETs, no high steps are produced on or over the substrate, resulting in an improved step coverage in an upper level of the substrate. This leads to a higher fabrication yield than the case of the conventional ones.

In the method according to the present invention, the first conductor film, the second conductor film and the third conductor film are preferably made of polysilicon, because polysilicon is readily to be processed.

Also, preferably, the first conductor film is made of polysilicon of a first conductivity type, and the third conductor film is made of polysilicon of a second conductivity type opposite to said first conductivity. This is due to the following facts (i) and (ii).

(i) The first conductor film is contacted with the base regions and is used for forming the base electrodes.

(ii) The third conductor film is contacted with the base regions and therefore, the impurity doped in the first conductor film can be thermally diffused into the base regions to produce the emitter regions.

In a preferred embodiment, the first patterned conductor film and the first patterned insulator film are obtained by a patterning process using a mask, and the second patterned conductor film and the second patterned insulator film are obtained by another patterning process using another mask. In this embodiment, the number of the necessary process steps can be reduced still more.

in another preferred embodiment, source/drain electrodes of the IGFETs are formed by the third patterned conductor film. In this embodiment, no additional process step is required for the formation of the source/drain regions.

In a further preferred embodiment, a step of forming an interlayer insulator film to cover the capacitor areas, the bipolar transistor areas and the IGPET areas between the step of forming the second patterned insulator film and that of forming the third patterned conductor film. The interlayer insulator film electrically insulates the emitter electrodes from the corresponding base electrodes.

In this embodiment, the emitter electrodes and the corresponding base electrodes are ensured to be electrically insulated from each other by controlling the thickness and/or material of the interlayer insulator film.

In a still further preferred embodiment, a step of forming an interlayer insulator film to cover the capacitor areas, the bipolar transistor areas and the IGFET areas between the step of forming the second patterned insulator film and that of forming the third patterned conductor film. The second patterned insulator film exists on top faces of the gate electrodes also to produce protection insulators for the respective gate electrodes. The protection insulators are covered with the interlayer insulator film.

In this embodiment, since the protection insulators made of the second insulator film cover the top faces of the gate electrodes, respectively, increased reliability can be obtained compared with the cases in which the gate electrodes are covered with the interlayer insulator film alone.

BRIEF DESCRIPTION OF THE DRAWINGS

FIGS. 3A to 3F are partial cross-sectional views of the semiconductor integrated circuit device of FIG. 2, which show the process steps of the fabrication method according to the embodiment of the invention.

DETAILED DESCRIPTION OF THE PREFERRED EMBODIMENTS

Figure 1:
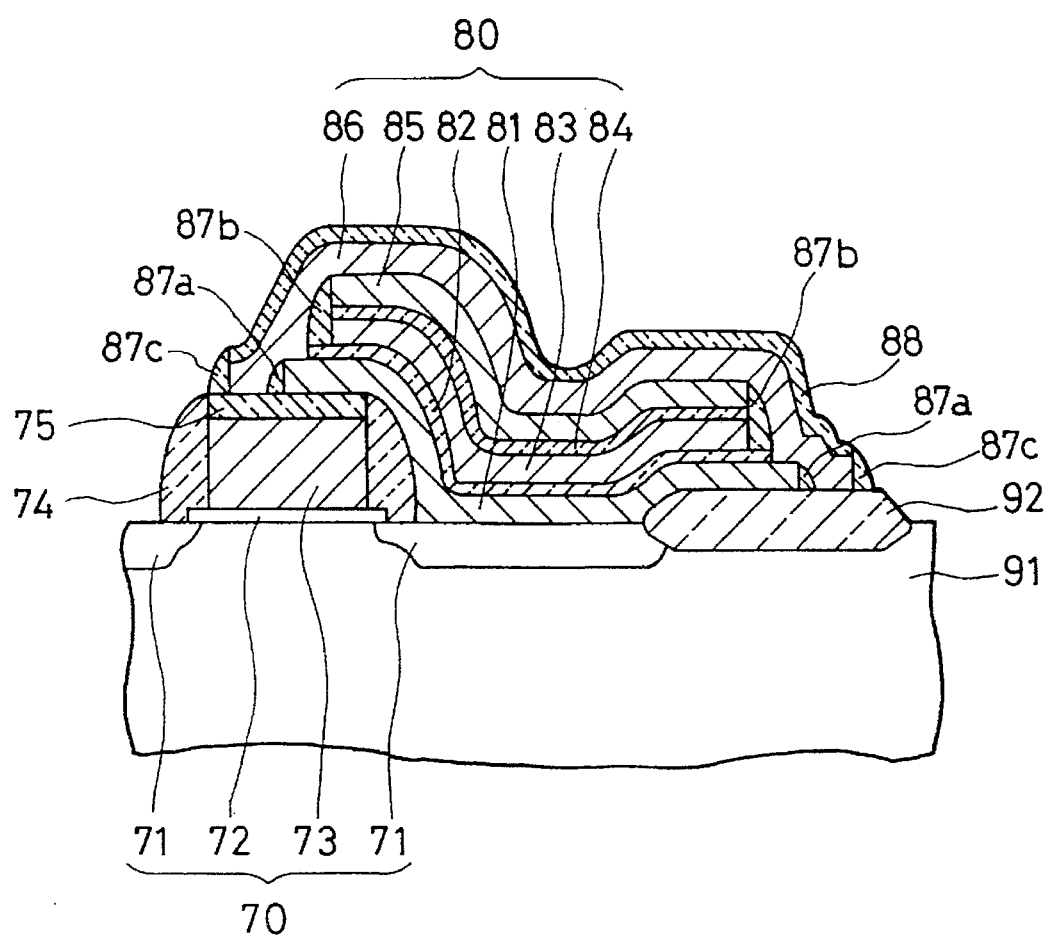
FIG. 1 is a partial cross-sectional view of a semiconductor integrated circuit device fabricated by a conventional method.

A preferred embodiment of the present invention will be described below while referring to the drawings attached.

In FIG. 2 and FIGS. 3A to 3F, a semiconductor integrated circuit device fabricated by a method according to an embodiment has a plurality of multi-layer MOS capacitors, a plurality of npn bipolar transistors and a plurality of n-channel MOSFETs. However, one of the capacitors, one of the transistors and one of the MOSFETs alone are drawn for the sake of simplification of description.

Figure 2:
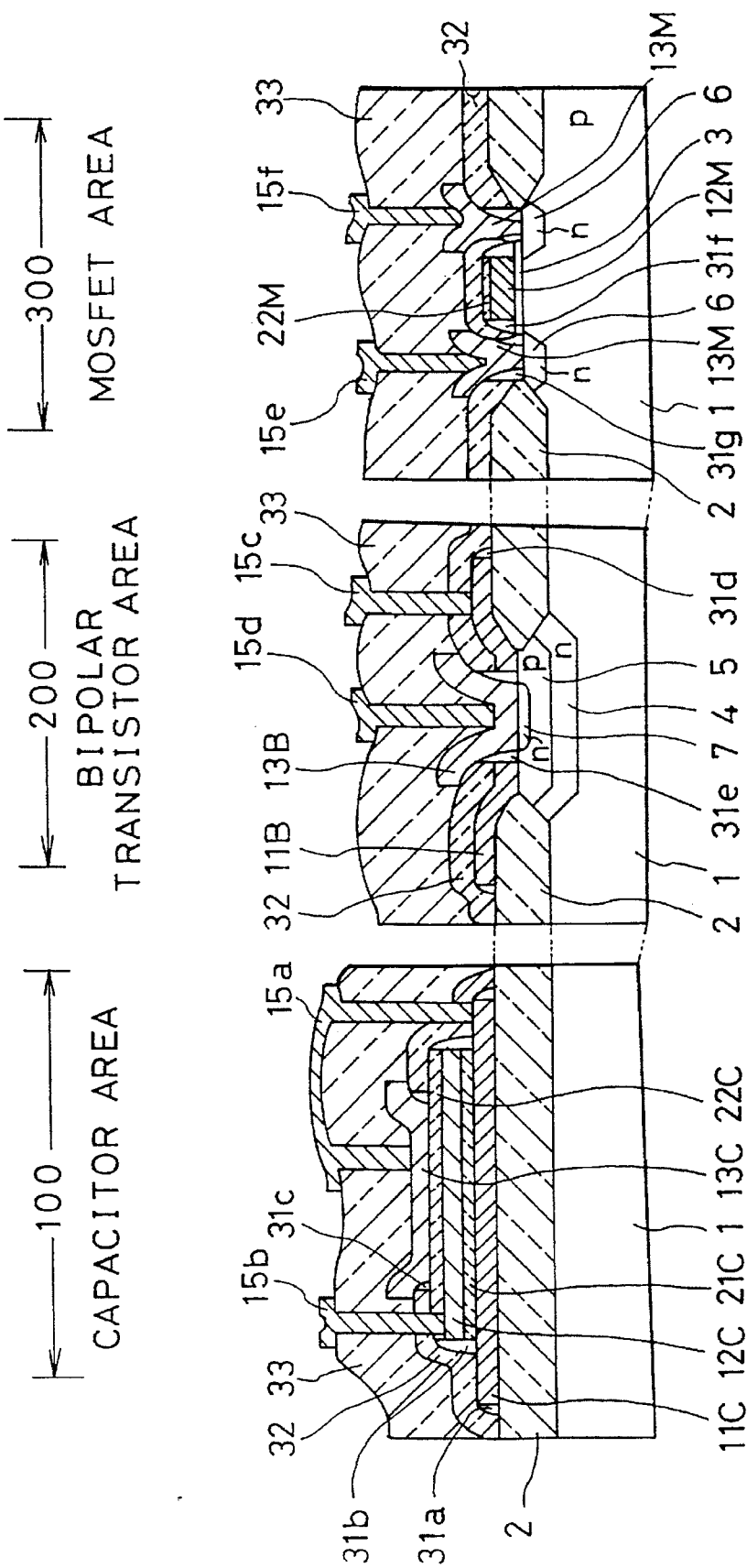
FIG. 2 is a partial cross-sectional view of a semiconductor integrated circuit device fabricated by a method according to an embodiment of the invention.

As shown in FIG. 2, a field oxide film 2 is selectively formed on a main surface of a p-silicon substrate 1, defining a first active region for the bipolar transistor and a second active region for the MOSFET thereon.

A bipolar transistor area 200 is defined as an area where the bipolar transistor is provided, which contains the first active region of the substrate 1 and the vicinity thereof on the field oxide film 2. An MOSFET area 300 is defined as an area where the MOSFET is provided, which contains the second active region of the substrate 1 and the vicinity thereof on the field oxide film 2. A capacitor area 100 is defined as an area where the capacitor is provided, which is arranged on the field oxide film 2 and is outside the bipolar transistor and MOSFET areas 200 and 300.

Here, the bipolar transistors and the MOSFETs are provided on the substrate 1 and therefore, the semiconductor integrate circuit device according to the embodiment is a so-called Bipolar MOS (BiMOS) LSI. However, p-channel MOSFETs may be additionally provided on the substrate 2 to be coupled with the n-channel MOSFETs, and in this case, the device will be a so-called Bipolar Complementary MOS (BiCMOS) LSI.

In the capacitor area 100, a first capacitor electrode 11C made of a patterned p-polysilicon film (200 nm in thickness) is formed on the field oxide film 2. A first dielectric 21C made of a patterned silicon nitride (Si3N4) film (20 nm in thickness) is formed on the first capacitor electrode 11C. A second capacitor electrode 12C made of a patterned n-polysilicon film (300 nm in thickness) is formed on the first dielectric 21C. A second dielectric 22C made of a patterned silicon nitride film (20 nm in thickness) is formed on the second capacitor electrode 12C. A third capacitor electrode 13C made of a patterned n-polysilicon film (200 nm in thickness) is formed on the second dielectric 22C.

The size of the first dielectric 21C is smaller than that of the first capacitor electrode 11C. The sizes of the first and second dielectrics 21C and 22C and the second capacitor electrode 12C are substantially the same as each other. The size of the third capacitor electrode 13C is smaller than .that of the second dielectric 22C.

An insulator sidewall 31a made of silicon dioxide (SiO2) is formed on the field oxide film 2 to surround the side face of the first capacitor electrode 11C. An insulator sidewall 31b made of silicon dioxide is formed on the first capacitor electrode 11C to surround the side face of the second capacitor electrode 12C and the side faces of the first and second dielectrics 21C and 22C.

A first interlayer insulator film 32 made of silicon dioxide film (200 nm in thickness) is formed to cover the sidewall 31a, the exposed first capacitor conductor 11C, the sidewall 31b, and the exposed second dielectric 22C. The periphery of the first interlayer insulator film 32 is covered with the third capacitor electrode 13C on the second dielectric 22C. The side face of the first interlayer insulator film 32 disposed on the second dielectric 32 is covered with an insulator sidewall 31c.

A second interlayer insulator film 33, which is made of silicon dioxide film far thicker than the first interlayer insulator film 32, is formed on the first interlayer insulator film 32 and the exposed third capacitor electrode 13C. The film 33 has first,.second and third contact holes that expose respectively the underlying first, second and third capacitor electrodes 11C, 12C, and 13C.

First and second interconnection conductors 15a and 15b each of which is Made of a patterned aluminum (Al) film, are formed on the second Interlayer insulator film 33. The first interconnection conductor 15a is contacted with the first and third capacitor electrodes 11C and 13C through the respective first and third contact holes, electrically interconnecting the electrodes 11C and 13C with each other. The second interconnection conductor 15b is contacted with the second capacitor electrode 12C through the second contact hole.

The multi-layer MOS capacitor provided in the capacitor area 100 is equivalent to a set or combination of parallel-connected first and second capacitors. The first capacitor is composed of the first and second capacitor electrodes 11C and 12C and the intervening first dielectric 21C. The second capacitor is composed of the second and third capacitor electrodes 12C and 13C and the intervening second dielectric 22C. Therefore, the MOS capacitor has a capacitance equal to the sum of the capacitances of the first and second capacitors.

In the bipolar transistor area 200, an n-collector region 4, a p-base region 5 and an n-emitter region 7 are formed in the first active region of the p-silicon substrate 1. The emitter region 7 is disposed at the center of the surface of the first active region, and the base region 5 is disposed in the periphery thereof. The collector region 4 is disposed under the collector region 5.

A base electrode 11B is formed on the field oxide film 2 to surround the first active region. The base electrode 11B is contacted with the base region 5 at its inner end to be electrically connected to the base region 5.

The base electrode 11B is made of a patterned p-polysilicon film having the same thickness and the same doping concentration as those of the first capacitor electrode 11C.

The first interlayer insulator film 32 covers the base electrode 11B and the exposed field oxide film 2. An insulator sidewall 31e made of silicon dioxide is formed on the first active region to surround the inner side face of the base electrode 11B and the exposed side face of the first interlayer insulator film 32 in the first active region. An insulator sidewall 31d made of silicon dioxide is formed on the field oxide film 2 to surround the outer side face of the base electrode 11B. The sidewall 31d is covered with the first interlayer insulator film 32.

An emitter electrode 13B is formed on the first active region to extend along the sidewall 31e and the first interlayer insulator film 32. The emitter electrode 13 is contacted with the emitter region 7 at its bottom end to be electrically connected to the emitter region 7.

The emitter electrode 11C is made of a patterned n-polysilicon film having the same thickness and the same doping concentration as those of the third capacitor electrode 13C.

The second interlayer insulator film 33 covers the emitter electrode 13B and the exposed first interlayer insulator film 32. The film 33 has fourth and fifth contact holes that expose respectively the underlying base and emitter electrodes 11B and 13B.

Third and fourth interconnection conductors 15c and 15d, each of which is made of a patterned aluminum film, are formed on the second interlayer insulator film 33. The third interconnection conductor 15c is contacted with the base electrode 11B through the fourth contact hole to be electrically interconnected with the electrode 11B. The fourth interconnection conductor 15d is contacted with the emitter electrode 13B through the fifth contact hole to be electrically interconnected with the electrode 13B.

The base electrode 11B is electrically insulated from the emitter electrode 13B by the first interlayer insulator film 32 having the thickness of 200 nm.

In the MOSFET area 300, a pair of n-source/drain regions 6 are formed apart from each other in the second active region of the substrate 1. A gate insulator film 3 is formed on the surface of the second active region between the pair of source/drain regions 6. A gate electrode 12M is formed on the gate insulator film 3.

The gate electrode 12M is made of a patterned n-polysilicon film having the same thickness and the same doping concentration as those of the second capacitor electrode 12C.

A pair of insulator sidewalls 31f made of silicon dioxide are formed at each side of the gate electrode 12M on the gate insulator film 3. A protection insulator 22M is formed on the top face of the gate electrode 12M. The pair of sidewalls 31f covers the side faces of the insulator 22M also.

A pair of source/drain electrodes 13M are formed at each side of the gate electrode 12M on the pair of source/drain regions 6. The first interlayer insulator film 32 covers the protection insulator 22M over the gate electrode 13M and the exposed field oxide film 2.

Four insulator sidewalls 31g made of silicon dioxide are formed on the pair of source/drain regions 6. The first one of the sidewalls 31g is disposed between one of the source/drain electrode 13M and the opposing side face of the first interlayer insulator film 32. The second one of the sidewalls 31g is disposed between the one of the source/drain electrodes 13M and the opposing side faces of the first interlayer insulator film 32. The third one of the sidewalls 31g is disposed between the other of the source/drain electrodes 13M and the opposing side face of the first interlayer insulator film 32. The fourth one of the sidewalls 31g is disposed between the other of the source/drain electrodes 13M and the opposing side faces of the first interlayer insulator film 32.

The source/drain electrodes 13M extend along the sidewall 31g and the first interlayer insulator film 32, respectively. The electrodes 13M are contacted with the source/drain regions 6 at their bottom ends to be electrically connected to the pair of source/drain regions 6, respectively.

The source/drain electrodes 13M are made of patterned n-polysilicon films each having the same thickness and the same doping concentration as those of the third capacitor electrode 13C.

The second interlayer insulator film 33 covers the pair of source/drain electrodes 13M and the exposed first interlayer insulator film 32. The film 33 has sixth and seventh contact holes that expose respectively the underlying source/drain electrodes 13M.

Fifth and sixth interconnection conductors 15e and 15f, each of which is made of a patterned aluminum film, are formed on the second interlayer insulator film 33. The fifth and sixth interconnection conductors 15e and 15f are contacted with the source/drain electrodes 13M through the sixth and seventh contact holes to be electrically interconnected with the electrodes 13M, respectively.

The semiconductor integrated circuit device shown in FIG. 2 is fabricated by the following process steeps, which will be explained below referring to FIGS. 3A to 3F and FIG. 2.

First, as shown in FIG. 3A, the p-silicon substrate 1 having the field oxide film 2 selectively formed thereon is prepared. The isolation insulator film 2 is produced by a thermal oxidation process of the substrate 1 and defines the first active region for the bipolar transistor and the second active region for the IGFET. The first active region contains the collector region 4 and the base region 5 that are produced by ion-implantation processes. A thin silicon dioxide film 3a is formed by a thermal oxidation process on the second active region.

Next, a p-type first polysilicon film 11 having a thickness of 200 nm is formed on the field oxide film 2 over the entire substrate 1 by a Chemical Vapor Deposition (CVD) process. The first polysilicon film 11 is contacted with the field oxide film 2 in the capacitor area 100, with the first active region i.e., the base region 5 in the bipolar transistor area 200, and with the silicon dioxide film 3a in the MOSFET area 300.

A first silicon nitride film 21 having a thickness of 20 nm is then formed on the first polysilicon film 11 over the entire substrate 1 by a CVD process. A first photoresist film 51 is formed on the first silicon nitride film 21 over the entire substrate 1. The photoresist film 51 is patterned by a is photolithography process to have a plan shape corresponding to the plan shape of the first capacitor electrode 11C in the capacitor area 100 and a plan shape corresponding to the plan shape of the contour of the base electrode 11B in the bipolar transistor area 200. The state at this stage is shown in FIG. 3A.

Subsequently, the first silicon nitride film 21 and the first polysilicon film 11 are selectively etched by two anisotropically dry etching processes using the patterned photoresist film 51 as a mask. The earlier one of the etching processes is performed under the condition that the etch rate for the silicon nitride film 21 is greater than that of the polysilicon film 11. The later one of the etching processes is performed under the condition that the etch rate for the polysilicon film 11 is greater than that of the silicon nitride film 21.

For example, as an etching gas, $CF_4$ or $CHF_3$ is employed in the earlier etching process, and $SF_6$ is employed in the later one.

Through the etching processes, in the capacitor area 100, the first dielectric 21C is produced by the first silicon nitride film 21, and the first capacitor electrode 11C is produced by the first polysilicon film 11. In the bipolar transistor area 200, the first silicon nitride film 21 and the first polysilicon film 11 patterned to have contours of the base electrode 11B. In the MOSFET area 300, the first silicon nitride film 21 and the first polysilicon film 11 are entirely removed to expose the second active regions.

After the photoresist film 51 is removed, the silicon dioxide film 3a in the MOSFET area 300 is removed to expose the second active region and then, the substrate 1 is thermally oxidized to produce the gate oxide film 3 on the exposed second active region, as shown in FIG. 3B. During this oxidation process, the surface area of the silicon nitride film 21 is oxidized to form a silicon dioxide layer (not shown).

An n-type second polysilicon film 12 having a thickness of 300 nm is then formed on the patterned first silicon nitride film 21 and the exposed field oxide film 2 over the entire substrate 1 by a CVD process. As shown in FIG. 3B, the second polysilicon film 12 covers the first capacitor electrode 11C and the first dielectric 21C in the capacitor area 100. The film 12 covers the patterned first silicon nitride film 21 and the first polysilicon film 11 in the bipolar transistor area 200. The film 12 is contacted with the gate oxide film 3 in the MOSFET area 300.

A second silicon nitride film 22 having a thickness of 20 nm is formed on the second polysilicon film 22 over the entire substrate 1 by a CVD process. After a second photoresist film 52 is formed on the second silicon nitride film 22 over the entire substrate 1, the film 52 is patterned by a photolithography process. As shown in FIG. 3B, the patterned photoresist film 52 has a plan shape corresponding to the plan shape of these second capacitor electrode 12C in the capacitor area 100. The film 52 has a plan shape corresponding to the gate electrode 12M in the MOSFET area 300. The film 52 is removed in the bipolar transistor area 200. The state at this stage is shown in FIG. 3B.

Subsequently, the second silicon nitride film 22 and the second polysilicon film 12 are selectively etched by three anisotropically dry etching processes using the patterned photoresist film 52 as a mask. The earlier one of the etching processes is performed under the condition that the etch rate for the silicon nitride film 22 is greater than that of the polysilicon film 12. The middle one of the etching processes is performed under the condition that the etch rate for the polysilicon film 12 is greater than that of the silicon nitride film 22. The later one of the etching processes is performed under the same condition as that of the earlier one.

Through the etching processes, as shown in FIG. 3C, in the capacitor area 100, the second dielectric 22C is produced by the second silicon nitride film 22, and the second capacitor electrode 12C is produced by the second polysilicon film 12. In the bipolar transistor area 200, not only the second silicon nitride film 22 and the second polysilicon film 12 but also the underlying, patterned first silicon nitride film 21 are entirely removed. In the MOSFET area 300, the gate electrode 12M is produced by the patterned second polysilicon film 12, and the protection insulator film 22M is produced by the patterned second silicon nitride film 22 on the top of the gate electrode 12M.

Since the protection insulator 22M is made of the same material as that of the second dielectric 22C, that is, the second silicon nitride film 22, the insulator 22M is effective in humidity resistance and impurity-ion immovability.

After the second photoresist film 52 is removed, a silicon dioxide film is formed over the entire substrate 1 by a CVD process and is then etched back. Thus in the capacitor area 100, the sidewall 31a is formed to surround the side face of the first capacitor electrode 11C and the sidewall 31b is formed to surround the side faces of the second capacitor electrode 12C and the first and second dielectrics 21C and 22C. In the bipolar transistor area 200, the sidewall 31d is formed to surround the side face of the remaining first polysilicon film having the contour of the base electrode 11B. In the MOSFET area 300, the pair of the sidewalls 31f are formed at each side of the gate electrode 12M on the gate oxide film 3.

Following this, in the MOSFET area 300, the pair of the n-source/drain regions 6 are produced in the second active region by an ion-implantation process using the gate electrode 12M and the sidewalls 31f as a mask. The source/drain region are formed in self-alignment to the gate electrode 12M and the sidewalls 31f. During this process, the capacitor area 100 and the bipolar transistor area 200 are covered with a masking film (not shown) to prevent the dopant ions from being implanted thereinto. The state at this stage is shown in FIG. 3C.

Subsequently, as shown in FIG. 3D, a silicon dioxide film as the first interlayer insulator film 32 having a thickness of 200 nm is deposited over the entire substrate 1 by a CVD process. The silicon dioxide film 32 covers the second dielectric 22C and the exposed first capacitor electrode 11C in the capacitor area 100. The film 32 covers the patterned first conductor film 11 in the bipolar transistor area 200. The film 32 covers the protection insulator 22M and the exposed second active region in the MOSFET area 300.

A third photoresist film (not shown) is formed on the first interlayer insulator film 32 to be patterned. Using the patterned photoresist film as a mask, the film 32 is anisotropically etched by a dry etching process under the condition that the etch rate for the silicon dioxide film 32 is greater than those for the other relating materials. Thus, a first window 61, a second window 62 and a pair of third windows 63 are produced in the first interlayer insulator film 32. The first window 61 exposes the second dielectric 22C in the capacitor area 100. The second window 62 exposes the first patterned polysilicon film 11 and is located over the base region 5 in the bipolar transistor area 200. The pair of the third windows 63 expose the pairs of source/drain regions, respectively, in the MOSFET area 300.

The remaining first polysilicon film 11 in the bipolar transistor area 200 is then selectively etched by a dry etching process to produce a fourth window 64 in the film 11. The fourth window 64 has a plan shape substantially the same as that of the second window 62 and is communicated with the second window 62, exposing the base region 5 therethrough. During this process, the capacitor area 100 and the MOSFET area 300 are covered with a masking film (not shown) to prevent the areas 100 and 300 from being etched. The state at this stage is shown in FIG. 3C.

Thus, in the capacitor area 100, the base electrode 11B is produced by the remaining first polysilicon film 11, and the center of the base region 5 is exposed through the second and fourth windows 62 and 64 of the first interlayer insulator film 32.

After the third photoresist film is removed, a silicon dioxide film is formed over the entire substrate 1 by a CVD process and is then etched back. Thus, in the capacitor area 100, the sidewall 31c is formed to surround the inner side face of the first interlayer insulator film 32. In the bipolar transistor area 200, the sidewall 31e is formed to surround the inner side faces of the base electrode 11B and the first interlayer insulator film 32. In the MOSFET area 300, the sidewalls 31g are formed on the source/drain regions 6 between the each side of the gate electrode 12M and the opposing sides of the first interlayer insulator film 32.

Subsequently, an n-type third polysilicon film is formed over the substrate 1 by a CVD process. The third polysilicon film is contacted with the second dielectric 22C through the first window 61 in the capacitor area 100, with the base region 5 through the second and fourth windows 62 and 64 in the bipolar transistor area 200, and with the source/drain regions 6 in the MOSFET areas 300.

A fourth photoresist film (not shown) is formed on the third polysilicon film to be patterned. Using the patterned photoresist film as a mask, the third polysilicon film is anisotropically etched by a dry etching process under the condition that the etch rate for the polysilicon film greater than those for the other relating materials. Thus, the third capacitor electrode 13C is produced in the capacitor area 100. The emitter electrode 3B is produced in the bipolar transistor area 200. The pair of source/drain electrodes. 13M are produced in the MOSFET area 300.

Figure 3E:
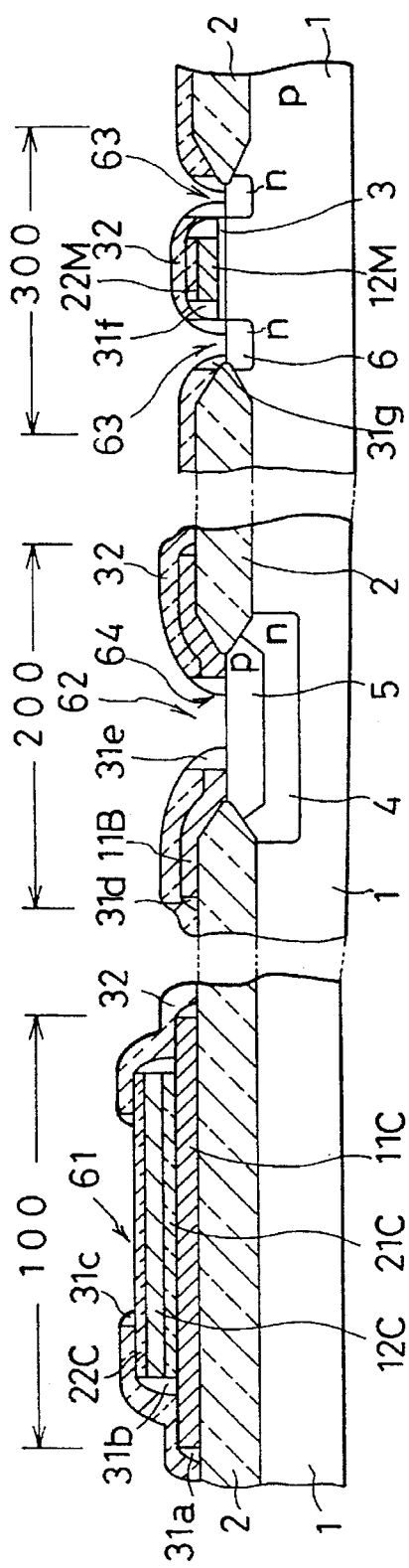
Figure 3F:
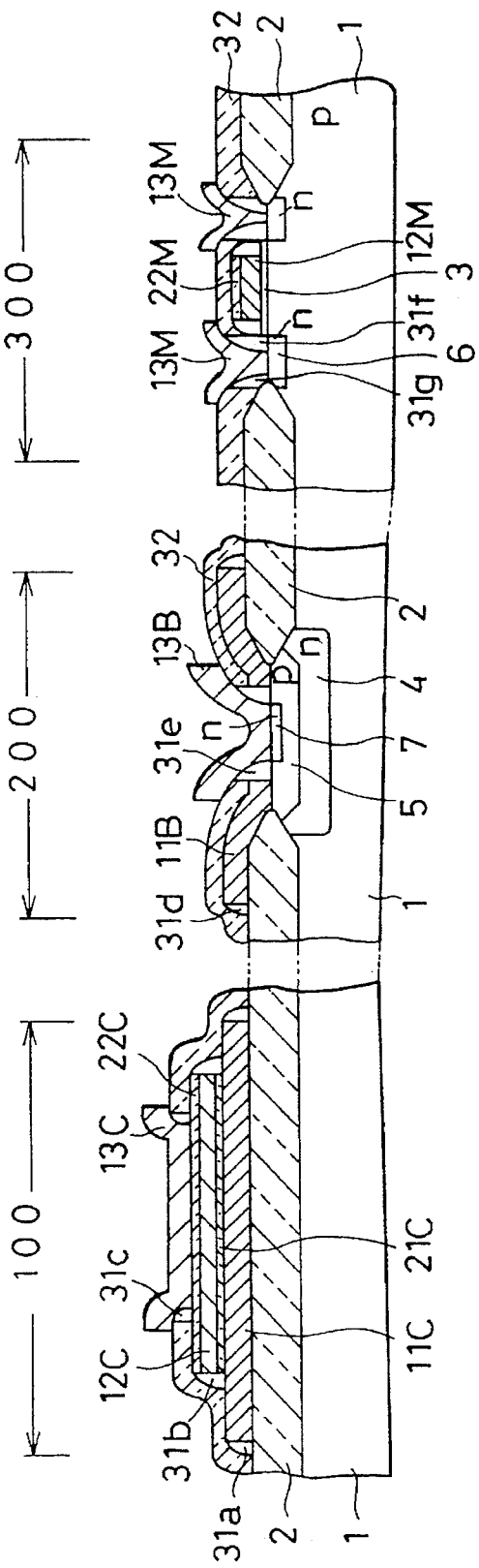

After the fourth photoresist film is removed, the substrate 1 is subjected to heat treatment. During this heat treatment, an n-impurity doped in the emitter electrode 13B diffuse into the p-base region 5, forming the n-emitter region 7 in the bipolar transistor area 200. At the same time, the n-impurity doped in the source/drain electrodes 13M diffuses into the source/drain regions 6, and the p-impurity doped in the base electrode 11B diffuses into the base region 5, resulting in contacts (not shown) tn the respective regions 6 and 5. The state at this stage is shown in FIG. 3F.

Further, a silicon dioxide film as the second interlayer insulator film 33 is deposited over the entire substrate 1 by a CVD process. The film 33 covers the third capacitor electrode 13C in the capacitor area 100, the emitter electrode 13B and the exposed first interlayer insulator film 32 in the bipolar transistor area 200, and the pair of source/drain electrodes 13M and the exposed first interlayer insulator film 32 in the MOSFET area 300.

Then, first to seventh contact holes are formed in the second interlayer insulator film 33. The first to third holes are placed in the capacitor area 100. The fourth and fifth holes are placed in the bipolar transistor area 200. The sixth and seventh holes are placed in the MOSFET area 300.

The first contact hole penetrates the first and second interlayer insulator films 32 and 33 to expose the first capacitor electrode 11C. The second contact hole penetrates the both films 32 and 33 to expose the second capacitor electrode 12C. The third contact hole penetrates the film 33 alone to expose the third capacitor electrode 13C.

The fourth contact hole penetrates the both films 32 and 33 to expose the base electrode 11B. The fifth contact hole penetrates the film 33 alone to expose the emitter electrode 13B.

The sixth and seventh contact holes penetrate the film 33 alone to expose the source/drain electrodes 13M, respectively.

Finally, an aluminum film for interconnection is deposited on the second interlayer insulator film 33 by an evaporation process over the entire substrate 1. The aluminum film is then patterned to produce the first to sixth interconnection conductors 15a to 15f.

In the capacitor area 100, the first interconnection conductor 15a as a first part of the aluminum interconnection film is electrically connected to the first and third capacitor electrodes 11C and 13C through the first and third contact holes. The second/interconnection conductor 15b as a second part of the interconnection film is electrically connected to the second capacitor electrode 12C through the second contact hole.

In the bipolar transistor area 200, the third interconnection conductor 15c as a third part of the interconnection film is electrically connected to the base electrode 11B through the third contact hole. The fourth interconnection conductor 15b as a fourth part of the interconnection film is electrically connected to the emitter electrode 13B through the fourth contact hole.

In the MOSFET area 300, the fifth and sixth interconnection conductors 15e and 15f as fifth and sixth parts of the interconnection film are electrically connected to the source/drain electrodes 13M through the fifth and sixth contact holes.

Through the process steps described above, the semiconductor integrated circuit device shown in FIG. 2 is obtained.

With the fabrication method of the semiconductor integrated circuit device according to the embodiment, the first capacitor electrode 11C and the base electrode 11B of the bipolar transistor are formed by the p-type first polysilicon film 11, the second capacitor electrode 12C and the gate electrode 12M of the MOSFET are formed by the n-type second polysilicon film 12, and the third capacitor electrode 13C and the emitter electrode 13B of the bipolar transistor are formed by the n-type third polysilicon film 13.

Therefore, the multi-layer MOS capacitor in the capacitor area 100 can be produced during the process steps for forming the bipolar transistor and the MOSFET with no additional process steps. This leads to a lower fabrication cost than the case of the conventional ones.

Also, since the MOS capacitor is not arranged to be stacked or overlapped on the bipolar transistor and the MOSFETs, no high steps are produced on or over the substrate 1, resulting in an improved step coverage in an upper level of the substrate. This leads to a higher fabrication yield than the case of the conventional ones.

In the method of this embodiment, the first polysilicon film 11 and the first silicon nitride film 21 are patterned by one patterning process, and the second polysilicon film 12 and the second silicon nitride film 22 are patterned by another patterning process. Therefore, the number of the necessary process steps can be reduced still more.

Also, the source/drain electrodes 13M of the MOSFET are formed by the third polysilicon film 13, and therefore, no additional process step is required for the formation of the source/drain electrodes 13M.

Since the first interlayer insulator film 32 electrically insulates the emitter electrode 13B from the base electrode 11B, the emitter and base electrodes 13B and 11B are ensured to be electrically insulated from each other by controlling the thickness and/or material of the first interlayer insulator film 32.

Because the protection insulator 22M is formed on the gate electrode 12M by the second silicon nitride film 22, and is covered with the first interlayer insulator film 32, increased reliability can be obtained compared with the case in which the gate electrode is covered with the first interlayer insulator film 32 alone.

In the above embodiment, the polysilicon films 11, 12 and 13 are employed as conductor films. However, as each of the conductor films, any refractory-metal silicide film such as tungsten silicide ($WSi_2$), and any composite structure such as the polycide structure made of a refractory-metal silicide film and a polysilicon film stacked on the silicide film may be employed.

Also, the silicon nitride films 12 and 13 are employed as insulator films. However, as each of the insulator films, any multi-layer structure such as a three-layer structure made of a thin silicon dioxide film, a silicon nitride film and a thin silicon dioxide film may be employed.

Further, Since the n-channel MOSFET having the n-polysilicon Gate electrode 12M is provided on the substrate 1, the n-type second polysilicon film 12 is employed. However, if a p-channel MOSFET having a p-polysilicon gate electrode is provided, the second polysilicon film 12 may be of an n-type.

While the preferred form of the present invention has been described, it is to be understood that modifications will be apparent to those skilled in the art without departing from the spirit of the invention. The scope of the invention, therefore, is to be determined solely by the following claims.

What is claimed is:

1. In a fabrication method of a semiconductor device containing capacitors, bipolar transistors and IGFETs on or over a semiconductor substrate, said capacitors being placed in capacitor areas, said bipolar transistors being placed in bipolar transistor areas, and said IGFETs being placed in IGFET areas;

each of said capacitors having a multi-layer structure of a first capacitor electrode located at a nearest level to said substrate, a first dielectric formed on said first capacitor electrode, a second capacitor electrode formed on said first dielectric, a second dielectric formed on said second capacitor electrode, and a third capacitor electrode formed on said second dielectric;

each of said bipolar transistors having a base electrode contacted with a base region formed in said substrate, and an emitter electrode contacted with an emitter region formed in said substrate;

each of said IGFETs having a gate insulator film formed on said substrate, and a gate electrode formed on said gate insulator film;

said method comprising the steps of:
(a) forming a first patterned conductor film to be contacted with said substrate in said bipolar transistor areas, said first conductor film having contours of said first capacitor electrodes in said capacitor areas and contours of said base electrodes in said bipolar transistor areas;
(b) forming a first patterned insulator film on said first capacitor electrodes to produce said first dielectric;
(c) forming a second patterned conductor film on said first capacitor electrodes and a gate insulator film formed on said substrate in said IGFET areas, said second conductor film having contours of said second capacitor electrodes in said capacitor areas and contours of aid gate electrodes in said IGFET areas;
(d) forming a second patterned insulator film on said second capacitor electrodes to produce said second dielectric;
(e) forming a third patterned conductor film on said second dielectric, said base regions and source/drain regions formed in said substrate in said IGFET areas, said third conductor film having contours of said third capacitor electrodes in said capacitor areas and contours of said emitter electrodes in said bipolar transistor areas.

2. A method as claimed in claim 1, wherein said first conductor film, said second conductor film and said third conductor film are made of polysilicon.

3. A method as claimed in claim 2, wherein said first conductor film is made of polysilicon of a first conductivity type, and said third conductor film is made of polysilicon of a second conductivity type opposite to said first conductivity.

4. A method as claimed in claim 1, wherein said first patterned conductor film and said first patterned insulator film are obtained by a patterning process using the same mask;

and wherein said second patterned conductor film and said second patterned insulator film are obtained by another patterning process using the same mask.

5. A method as claimed in claim 1, wherein source/drain electrodes of said IGFETs are formed by said third patterned conductor film during said step of (e).

6. A method as claimed in claim 1, further comprising a step of forming an interlayer insulator film to cover said capacitor areas, said bipolar transistor areas and said IGFET areas between said steps of (d) and (e);

wherein said interlayer insulator film electrically insulates said emitter electrodes from said corresponding base electrodes.

7. A method as claimed in claim 1, further comprising a step of forming an interlayer insulator film to cover said capacitor areas, said bipolar transistor areas and said IGFET areas between said steps of (d) and (e);

wherein said second patterned insulator film exists on top faces of said gate electrodes also to produce protection insulators for said respective gate electrodes;

and wherein said protection insulators are covered with said interlayer insulator film.

8. A fabrication method of a semiconductor integrated circuit device having capacitors, bipolar transistors and IGFETs on or over a semiconductor substrate, said capacitors being placed in capacitor areas, said bipolar transistors being placed in bipolar transistor areas, and said IGFETs being placed in IGFET areas;

said method comprising the steps of:
(a) preparing a semiconductor substrate having an isolation insulator film selectively formed therein to define first active regions for bipolar transistors and second active regions for IGFETs;
each of said first active regions containing a collector region and a base region;
(b) forming a first conductor film on said isolation insulator film over said entire substrate, said first conductor film being contacted with said first active regions and covering said second active regions;
(c) forming a first insulator film on said first conductor film over said entire substrate;
(d) forming a first patterned mask on said first insulator film;
(d) patterning said first insulator film and said first conductor film using said first mask to produce first capacitor electrodes and first dielectrics in said capacitor areas and to have contours of base electrodes in said bipolar transistor areas;
said first insulator film and said first conductor film being removed to expose said second active regions in said IGFET areas;
(e) forming gate insulator films on said exposed second active regions, respectively;
(f) forming a second conductor film over said entire substrate, said second conductor film covering said first capacitor electrodes and said first dielectrics in said capacitor areas, said patterned first insulator film and said patterned first conductor film in said bipolar transistor areas, and said gate insulator film in said IGFET areas;
(g) forming a second insulator film on said second conductor film over said entire substrate;
(h) forming a second patterned mask on said second insulator film;
(i) patterning said second insulator film and said second conductor film using said second mask to produce second capacitor electrodes and second dielectrics in said capacitor areas, and gate electrodes ad protection insulators in said IGFET areas;
said second insulator film, said second conductor film, and said patterned first insulator film being removed in said bipolar transistor areas;
(j) forming pairs of source/drain regions in said respective second active regions in self-alignment to said gate electrodes;
(k) forming a first interlayer insulator film over said entire substrate, said first interlayer insulator film covering said second dielectrics in said capacitor areas, said patterned first conductor film in said bipolar transistor areas, and said protection insulators in sad IGPET areas;
(l) making first windows, second windows and third windows in said first interlayer insulator film, said first windows exposing said respective second dielectrics, said second windows exposing, said first patterned conductor film and being located over said respective base regions, and said third windows exposing said respective pairs of source/drain regions;

(m) making fourth windows in said first patterned conductor film in said bipolar transistor areas, said fourth windows exposing said base regions and being communicated with said respective second windows;

said remaining first conductor film constituting said base electrodes;

(n) forming a third conductor film over said substrate, said third conductor film being contacted with said second dielectrics through said first windows in said capacitor areas, with said base regions through said second windows and said corresponding fourth windows in said respective bipolar transistor areas, and with said pairs of source/drain regions in said IGFET areas;

(o) patterning said third conductor film to produce third capacitor electrodes in said capacitor areas, emitter electrodes in said bipolar transistor areas, and pairs of source/drain electrodes in said IGFET areas;

(p) forming emitter regions in said respective first active regions in said bipolar transistor areas by heat treatment, said emitter regions being produced by diffusion of an impurity doped in said emitter electrodes;

(q) forming a second interlayer insulator film over said entire substrate, said second interlayer insulator film covering said third conductors in said capacitor areas, said emitter electrodes and said exposing first interlayer insulator film in said bipolar transistor areas, and said pairs of source/drain electrodes and said exposing said first interlayer insulator film in said IGFET areas;

(r) making first holes exposing said respective first conductors, second holes exposing said respective second conductors, third holes exposing said respective third conductors, fourth holes exposing said respective base electrodes, fifth holes exposing said respective emitter electrodes, and sixth holes exposing said respective pairs of said source/drain electrodes in said second interlayer insulator film; and (s) forming a patterned interconnection film on said second interlayer insulator film over said entire substrate;

said interconnection film having first parts contacted with said first conductors through said respective first holes and with said third conductors through said respective third conductors in said capacitor areas:

said interconnection film having second parts contacted with said second conductors through said respective second holes in said capacitor areas;

said interconnection film having third parts contacted with said base electrodes through said respective fourth holes in said bipolar transistor areas;

said interconnection film having fourth parts contacted with said emitter electrodes through said respective fifth holes in said bipolar transistor areas;

said interconnection film having fifth parts contacted with said respective pairs of said source/drain electrodes through said respective sixth holes.

9. A method as claimed in claim 8, wherein said first conductor film, said second conductor film and said third conductor film are made of polysilicon.

10. A method as claimed in claim 9, wherein said first conductor film is made of polysilicon of a first conductivity type, and said third conductor film is made of polysilicon of a second conductivity type opposite to said first conductivity.

11. A method as claimed in claim 8, wherein said first interlayer insulator film electrically insulates said emitter electrodes form said corresponding base electrodes.

* * * * *